United States Patent [19]

Yamada et al.

[11] Patent Number: 5,029,222

[45] Date of Patent: Jul. 2, 1991

[54] PHOTOELECTRON IMAGE PROJECTION APPARATUS

[75] Inventors: Akio Yamada, Kawasaki; Hiroshi Yasuda, Yokohama; Kiichi Sakamoto, Tokyo; Jinko Kudou, Kawasaki, all of Japan

[73] Assignee: Fujitsu Limited, Kawasaki, Japan

[21] Appl. No.: 238,047

[22] Filed: Aug. 30, 1988

[30] Foreign Application Priority Data

Sep. 2, 1987 [JP] Japan .................................. 62-219366
Sep. 2, 1987 [JP] Japan .................................. 62-219372

[51] Int. Cl.⁵ .............................................. G06K 9/00
[52] U.S. Cl. ........................................ 382/8; 356/237; 358/106; 250/363.01
[58] Field of Search ............................ 382/8; 356/237; 358/106; 250/363.01

[56] References Cited

U.S. PATENT DOCUMENTS

| | | | |
|---|---|---|---|
| 3,946,203 | 3/1976 | Hecht et al. | 382/17 |
| 4,573,195 | 2/1986 | de France | 382/6 |
| 4,748,327 | 5/1988 | Shinozaki et al. | 250/358.1 |
| 4,809,308 | 2/1989 | Adams et al. | 378/99 |
| 4,809,341 | 2/1989 | Matsui et al. | 382/8 |

*Primary Examiner*—Leo H. Boudreau
*Assistant Examiner*—Dan Santos
*Attorney, Agent, or Firm*—Staas & Halsey

[57] ABSTRACT

A photoelectron image projection apparatus has a device for detecting an image of a pattern of a mask within a predetermined projection region of the mask. An image signal describing the detected image is compared with a reference image signal which is known from the pattern of the mask, and a defect in the projection pattern is detected when the two compared image signals differ.

8 Claims, 6 Drawing Sheets

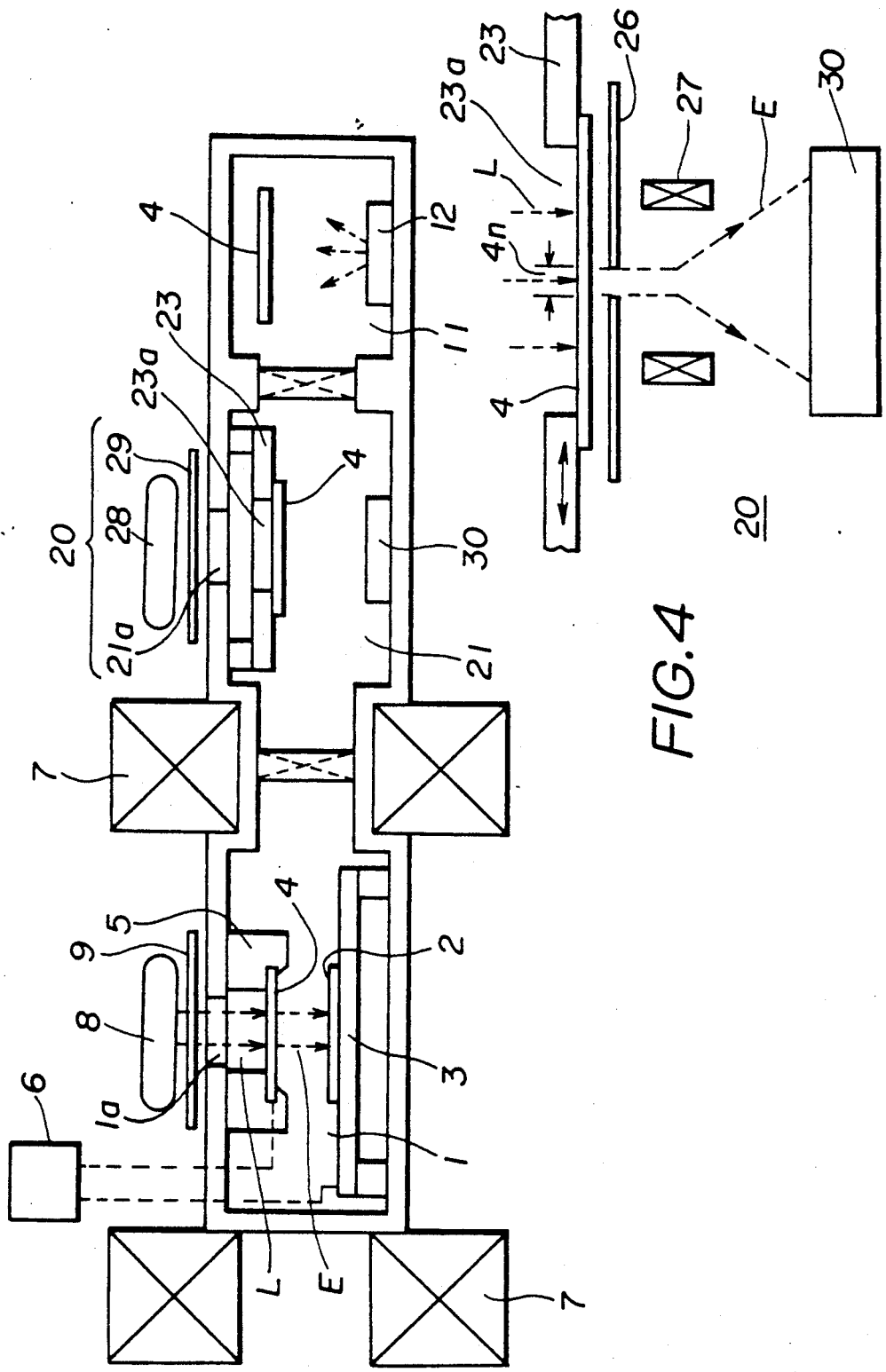

PHOTOELECTRON IMAGE PROJECTION APPARATUS

BACKGROUND OF THE INVENTION

The present invention generally relates to photoelectron image projection apparatuses, and more particularly to a photoelectron image projection apparatus which projects a pattern of a mask onto a wafer by irradiating photoelectrons released from the mask which is deposited with a photoelectric layer.

As a fine pattern technique of producing a semiconductor integrated circuit such as a very large scale integrated circuit (VLSI), there is an exposure technique in which a fine pattern is exposed on a wafer. A photoelectron image projection apparatus which uses photoelectron image projection has a high resolution, and active research is made on the new exposure technique as enabling a finer pattern projection. The photoelectron image projection apparatus has an advantage in that the through-put is high because it uses the projection system, and improvements on the photoelectron image projection apparatus are highly desired.

FIG. 1 generally shows a conventional photoelectron image projection apparatus, and FIG. 2 shows a mask which is used in the photoelectron image projection apparatus.

In FIG. 1, the image projection is carried out inside a projection chamber 1 under vacuum, and a wafer stage 3 and a mask holder 5 are arranged within the projection chamber 1. The wafer stage 3 holds a wafer 2 and is movable for changing the projection position on the wafer 2. The mask holder 5 holds a mask 4 at a position confronting in opposed relationship to the wafer 2. A high voltage is applied to the mask 4, relatively to the stage 3, by a high voltage source 6, and a magnetic field is applied, in a direction of from the mask 4 to the wafer 2, by coils 7. A light source 8 for emitting an ultraviolet light L and a shutter 9 are arranged outside a window 1a which is provided at a position in the wall of the projection chamber 1 above the mask 4.

As shown in FIG. 2, a patterned opaque layer 4b for blocking the ultraviolet light L is formed on a substrate 4a which transmits the ultraviolet light L. A photoelectric layer 4c which releases the photoelectrons when irradiated with the ultraviolet light L is deposited on the entire surface of the substrate 4a provided with the patterned opaque layer 4b.

The ultraviolet light L from the light source 8 is irradiated onto the mask 4 from the side of the substrate 4a when the shutter 9 is open, and the ultraviolet light L which is not blocked by the patterned opaque layer 4b reaches the corresponding, remaining portions of the photoelectric layer 4c, so that photoelectrons E are released from those portions of the photoelectric layer 4c receiving the ultraviolet light L. The photoelectrons E are accelerated by the electrical field and the magnetic field between the mask 4 and the wafer 2 and are converged onto the wafer 2. As a result, a pattern formed by the portions of layer 4c which release the photoelectrons E, is projected onto the wafer 2.

The photoelectric layer 4c of the mask 4 uses a material which includes cesium as one of the elements and which a large photoelectric effect and cannot maintain a stable state in an atmospheric air environment. Hence, the photoelectric layer 4c is deposited by a vapor deposition under vacuum and then used for the projection without exposing the photoelectric layer 4c to the atmospheric air.

Accordingly, in FIG. 1, a vapor deposition chamber 11 for depositing the photoelectric layer 4c under vacuum is connected to the projection chamber 1. A vapor deposition source 12 of the photoelectric layer 4c is provided within the vapor deposition chamber 11.

In the conventional photoelectron image projection apparatus, the intensity distribution of the photoelectrons E within the projection pattern becomes non-uniform and causes a non-uniform projection of the pattern as a result of the distribution of the photoelectric layer 4c being non-uniform. For example, the non-uniform distribution of the photoelectric layer 4c may be caused by the deposition state of the photoelectric layer 4c, that is, the contamination of the photoelectric layer 4c and the irregular thickness of the photoelectric layer 4c. When the non-uniform projection of the pattern occurs, there are problems in that the obtained pattern is defective and this results in the loss of time and waste of material.

On the other hand, the mask 4 deposited with the photoelectric layer 4c inside the deposition chamber 11 is used as it is for the projection in the projection chamber 1. For this reason, a defect is generated in the obtained pattern when a foreign substance such as a dust particle adheres onto the mask 4 when being transported or subjected to the vapor deposition of the photoelectric layer 4c. Again, this results in the loss of time and waste of material.

Therefore, the conventional photoelectron image projection apparatus has no means of checking the projection pattern and a defect in the pattern can only be detected by actually checking the pattern formed on the wafer 2. Thus, when a defect is detected in the pattern formed on the wafer 2, the photoelectron image projection apparatus must, at once, be stopped to remove the cause of the defect, that is, to replace the defective mask 4 with a new mask, and the pattern formed on the next wafer must again be checked for defects. As a result, the production efficiency of the conventional photoelectron image projection apparatus is poor.

SUMMARY OF THE INVENTION

Accordingly, it is a general object of the present invention to provide a novel and useful photoelectron image projection apparatus in which the problems described heretofore are eliminated.

Another and more specific object of the present invention is to provide a photoelectron image projection apparatus having means for detecting a photoelectron intensity distribution within a predetermined projection region of a mask, and means for detecting a defect in the projection pattern by comparing an image signal describing the detected photoelectron intensity distribution and a reference image signal which describes a reference distribution which is known from the pattern of the mask. According to the apparatus of the present invention, it is possible to detect a defect such as a non-uniform distribution of a photoelectric layer of the mask before the projection is actually carried out. Therefore, it is possible to prevent loss of time and waste of material, and to form the pattern on a wafer with a high production efficiency.

Still another object of the present invention is to provide a photoelectron image projection apparatus having means for detecting an enlarged image of a pattern of a mask within each of divided projection regions of the mask, and means for detecting a defect in the projection pattern by comparing an image signal describing each detected enlarged image and a reference image signal describing a reference image which is known from the pattern of the mask. According to the apparatus of the present invention, it is possible to detect a defect in the pattern of the mask before the projection is actually carried out. Thus, it is possible to prevent loss of time and waste of material, and to form the pattern on a wafer with a high production efficiency.

Other objects and further features of the present invention will be apparent from the following detailed description when read in conjunction with the accompanying drawings.

BRIEF DESCRIPTION OF THE DRAWINGS

FIG. 3 is a side view in cross section generally showing a first embodiment of the photoelectron image projection apparatus according to the present invention;

FIG. 4 shows a pattern detecting device of the photoelectron image projection apparatus shown in FIG. 3 on an enlarged scale;

DETAILED DESCRIPTION

Figure 1:
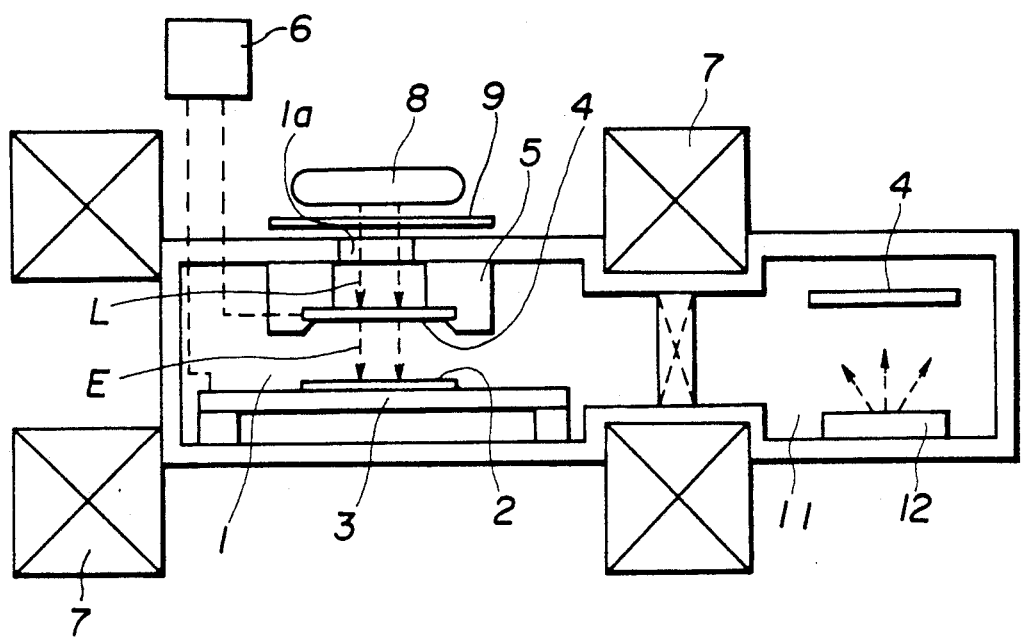
FIG. 1 is a side view in cross section generally showing the conventional photoelectron image projection apparatus.

FIG. 3 shows a first embodiment of the photoelectron image projection apparatus according to the present invention. In FIG. 3, those parts which are essentially the same as those corresponding parts in FIG. 1 are designated by the same reference numerals, and a description thereof will be omitted. In this embodiment, a pattern detecting chamber 21 is provided between the projection chamber 1 and the vapor deposition chamber 11, and a pattern detecting device 20 is provided at the pattern detecting chamber 21. FIG. 4 shows the pattern detecting device 20 on an enlarged scale.

Figure 2:
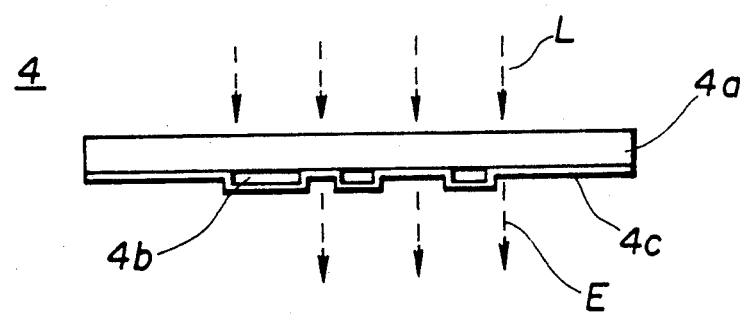
FIG. 2 is a side view showing a mask used on the conventional photoelectron image projection apparatus shown in FIG. 1.

The pattern detecting chamber 21 is under vacuum and is connected to the projection chamber 1 and the vapor deposition chamber 11. The mask 4 shown in FIG. 2 is transported into and out of the pattern detecting chamber 21. A mask holder 23, an acceleration electrode 26, an electromagnetic lens system 27 and at least a projection surface of a two-dimensional electron beam detector 30 are arranged within the pattern detecting chamber 21. The mask holder 23 has a window 23a, and the mask holder 23 holds and moves the mask 4 in a direction parallel to the surface of the mask 4. The acceleration electrode 26 accelerates the photoelectrons E released from a section 4n out of a plurality of divided sections of the projection region of the mask 4. The electromagnetic lens system 27 deflects the photoelectrons E so as to enlarge the pattern of the section 4n, and the enlarged image of the pattern is projected on the two-dimensional electron beam detector 30.

In addition, similarly as in the case of the projection carried out in the conventional apparatus described before, a light source 28 and a shutter 29 are arranged outside the window 21a in the side wall of the pattern detecting chamber 21. The light source 28 emits the ultraviolet light L for releasing the photoelectrons E from the mask 4.

Accordingly, out of the divided sections of the projection region of the mask 4, the section 4n for example becomes the subject of the projection and the enlarged image of the pattern is projected on the two-dimensional electron beam detector 30. The mask holder 23 moves the mask 4 and successively changes the section which becomes the subject of the projection, thereby projecting a succession of enlarged images, the composite thereof corresponding to the entire projection region of the mask 4.

For example, the size of the section 4n is 0.1 mm by 0.1 mm, and the pattern is enlarged by the electromagnetic lens system 27 with a magnification in the range of 100 to 500 so that the size of the section 4n coincides with the size of the projection surface of the two-dimensional electron beam detector 30.

Figure 5:
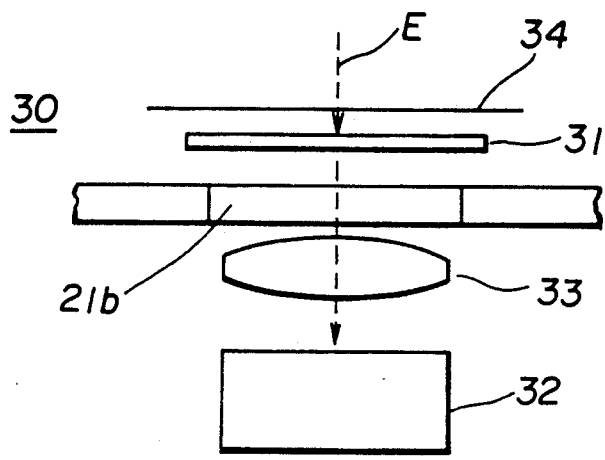
FIG. 5 is a side view showing a first embodiment of a two-dimensional electron beam detector of the photoelectron image projection apparatus shown in FIG. 3.

FIG. 5 shows a first embodiment of the two-dimensional electron beam detector 30. As shown, the two-dimensional electron beam detector 30 has a fluorescent plate 31, a television camera 32 and a lens system 33 for optically coupling the fluorescent plate 31 and the television camera 32. The fluorescent plate 31 is arranged within the pattern detecting chamber 31, and the television camera 32 is arranged outside the pattern detecting chamber 31 through the window 31a. The fluorescent plate 31 becomes the projection surface of the enlarged image formed by the photoelectrons E and thus functions to display the pattern of the enlarged image, and the television camera 32 converts the displayed pattern into an image signal. It is possible to omit the lens system 33 if the television camera 32 can directly pick up the image from the fluorescent plate 31.

When the fluorescent plate 31 displays the pattern of the enlarged image, the ultraviolet light L transmitted through the mask 4 may mix in as a noise signal source. In such a case, a light metal film 34 such as an aluminum film having a thickness of 1 micron is arranged in front of the fluorescent plate 31 so as to cut out the light which becomes the source of the noise.

Figure 6:
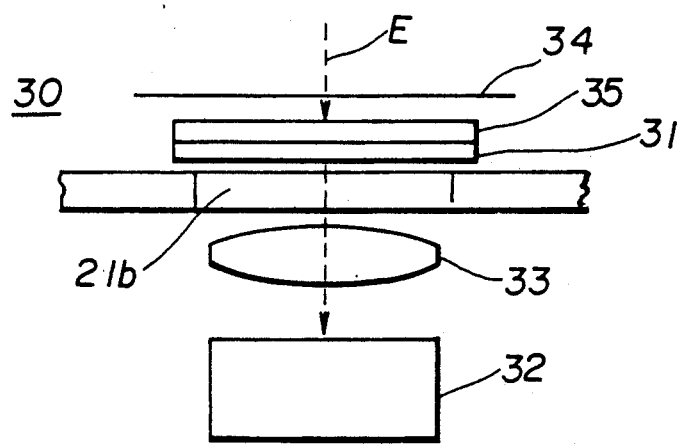
FIG. 6 is a side view showing a second embodiment of a two-dimensional electron beam detector of the photoelectron image projection apparatus shown in FIG. 3.

FIG. 6 shows a second embodiment of the two-dimensional electron beam detector 30. In FIG. 6, those parts which are the same as those corresponding parts in FIG. 5 are designed by the same reference numerals, and a description thereof will be omitted. In this embodiment, a two-dimensional electron beam multiplier 35 is arranged on top of the fluorescent plate 31. For example, the two-dimensional electron beam multiplier 35 is a microchannel plate (MCP) and becomes the projection surface of the enlarged image formed by the photoelectrons E. The two-dimensional electron beam multiplier 35 multiplies the intensity of the photoelectrons E at each portion within the projection surface so as to increase the input with respect to the fluorescent plate 31. The remaining parts of this embodiment are identical to those of the first embodiment shown in FIG. 5. The light metal film 34 is provided according to need.

Figure 7:
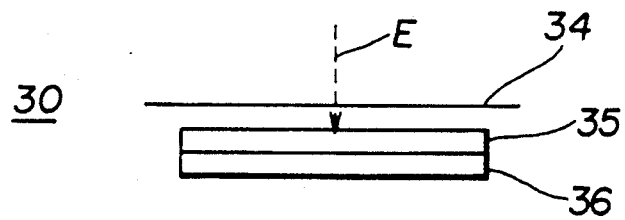
FIG. 7 is a side view showing a third embodiment of a two-dimensional electron beam detector of the photoelectron image projection apparatus shown in FIG. 3.

FIG. 7 shows a third embodiment of the two-dimensional electron beam detector 30. In FIG. 7, those parts which are the same as those corresponding parts in FIG. 6 are designated by the same reference numerals, and a description thereof will be omitted. In this embodiment, the two-dimensional electron beam multiplier 35 becomes the projection surface of the enlarged image, and a two-dimensional electron beam detecting element 36 such as a two-dimensional charge coupled device (CCD) is arranged under the two-dimensional electron beam multiplier 35. The two-dimensional electron beam multiplier 35 and the two-dimensional electron beam detecting element 36 are arranged as a body, or an assembly, within the pattern detecting chamber 21. The two-dimensional electron beam detecting element 36 converts the enlarged image formed by the photoelectrons E into an image signal, as an alternative to the fluorescent plate 31 and the television camera 32. The light metal film 34 is provided according to need, as described before.

The resolution of the two-dimensional electron beam detector 30 described heretofore is in the order of 500 to 1000 picture elements by 500 to 1000 picture elements. Hence, when the section 4n has the size of 0.1 mm by 0.1 mm, the resolution with respect to the pattern of the section 4n is in the range of 0.2 micron to 0.1 micron.

Figure 8:
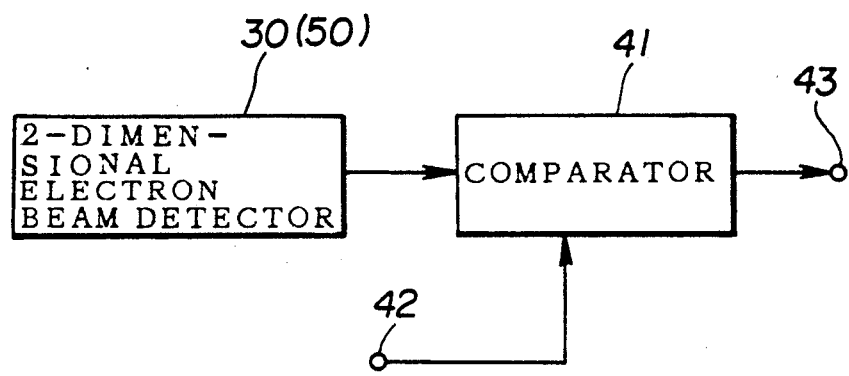
FIG. 8 shows a part of the first embodiment of the photoelectron image projection apparatus wherein the defect of the projection pattern is detected.

FIG. 8 shows a part of the first embodiment of the photoelectron image projection apparatus wherein the defect of the projection pattern is detected. The output image signal of the two-dimensional electron beam detector 30 is supplied to a comparator 41. The comparator 41 is also supplied with a reference image signal, describing the regular pattern of the mask 4, from a terminal 42. When the two compared image signals coincide in the comparator 41, it is detected from an output signal of the comparator 41 produced at an output terminal 43 that there is no defect in the projection pattern formed by the photoelectrons E released from the mask 4. On the other hand, when the two compared image signals differ in the comparator 41, it is detected from the output signal of the comparator 41 that there is a defect in the projection pattern formed by the photoelectrons E released from the mask 4. Furthermore, because the mask 4 is inside the pattern detecting chamber 21 when the defect in the projection pattern is detected, the photoelectric layer 4c of the mask 4 will not be exposed to the atmospheric air and be deteriorated.

Therefore, according to the first embodiment of the photoelectron image projection apparatus, the defect in the projection pattern can be detected inside the pattern detecting chamber 21 prior to the actual exposure being carried out in the projection chamber 1. Hence, the mask 4 can be changed before the actual exposure when a defect is detected in the projection patter, thereby preventing loss of time and waste of material, and the production efficiency is greatly improved over the conventional photoelectron image projection apparatus. In addition, the defect can be detected without deteriorating the photoelectric layer 4c of the mask 4.

Figure 9:
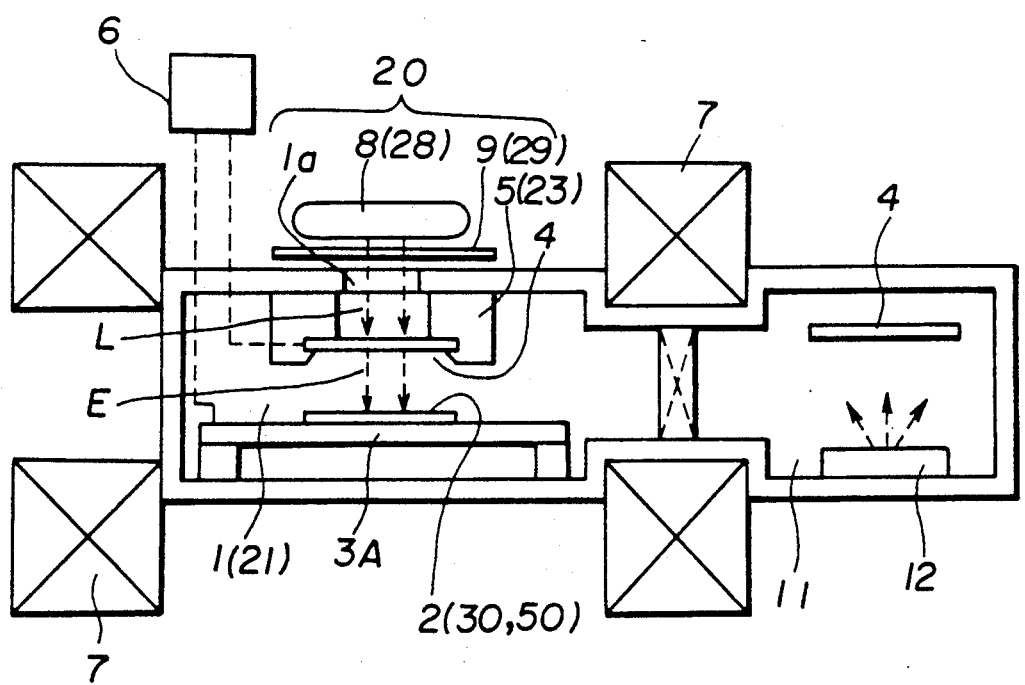
FIG. 9 is a side view in cross section generally showing a modification of the first embodiment of the photoelectron image projection apparatus according to the present invention.

In the first embodiment of the photoelectron image projection apparatus, the pattern detecting device 20 is separated from the projection chamber 1. However, it is possible to provide the pattern detecting device 20 inside the projection chamber 1 in accordance with a modification of the first embodiment of the photoelectron image projection apparatus shown in FIG. 9. In FIG. 9, those parts which are essentially the same as those corresponding parts in FIG. 3 are designated by the same reference numerals, and a description thereof will be omitted.

In FIG. 9, the light source 8, the shutter 9 and the mask holder 5 are used as the light source 28, the shutter 29 and the mask holder 23, respectively, of the pattern detecting device 20. In addition, the wafer stage 3A is designed to hold both the wafer 2 and the two-dimensional electron beam detector 30 and can move both the wafer 2 and the two-dimensional electron beam detector 30 to the position confronting the mask 4.

Figure 10:
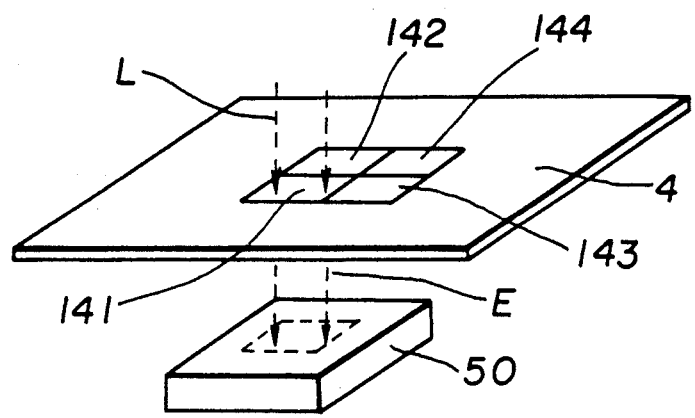
FIG. 10 is a perspective view showing the relationship of a mask and a two-dimensional electron beam detector of a second embodiment of the photoelectron image projection apparatus according to the present invention.

Next, a description will be given of a second embodiment of the photoelectron image projection apparatus according to the present invention, by referring to FIG. 10. FIG. 10, generally shows the relationship of the mask 4 and a two-dimensional electron beam detector 50 which is provided in place of the two-dimensional electron beam detect 30 shown in FIG. 9. The two-dimensional electron beam detector 50 is basically the same as the two-dimensional electron beam detector 30 except that no means is provided to enlarge the image in the two-dimensional electron beam detector 50. The remaining parts of the photoelectron image projection apparatus are basically the same as those of the modification of the first embodiment shown in FIG. 9, and a description and illustration thereof will be omitted.

In FIG. 10, the ultraviolet light L from the light source 28 is irradiated onto the mask 4 so as to release the photoelectrons E from the mask 4. Accordingly, out of the plural projection regions 141 through 144 of the mask 4, the individual projection region 141, for example, becomes the subject of the projection and the pattern is projected on the two-dimensional electron beam detector 50. The mask holder 23 (5) moves the mask 4 and thereby selectively changes the projection region which becomes the subject of the projection when a defect is detected in the pattern of the projection region 141 as will be described later. The two-dimensional electron beam detector 50 detects the photoelectron intensity distribution of the projection region 141 in this case, and the output image signal of the two-dimensional electron beam detector 50 is supplied to the comparator 41 shown in FIG. 8. The comparator 41 is also supplied with the reference image signal describing the regular photoelectron intensity distribution of the projection region 141 of the mask 4. When the two compared image signals coincide in the comparator 41, it is detected from the output signal of the comparator 41 that there is no defect in the projection pattern formed by the photoelectrons E released from the mask 4, that is, the photoelectric layer 4c of the mask 4 is uniform at the projection region 141. On the other hand, when the two compared image signals differ in the comparator 41, it is detected from the output signal of the comparator 41 that there is a defect in the projection pattern formed by the photoelectrons E released from the mask 4, that is, the photoelectric layer 4c of the mask 4 is non-uniform at the projection region 141. Furthermore, because the mask 4 is inside the pattern detecting chamber 21 (1) when the defect in the projection pattern is detected, the photoelectric layer 4c of the mask 4 will not be exposed to the atmospheric air and thus not be deteriorated.

Figure 11:
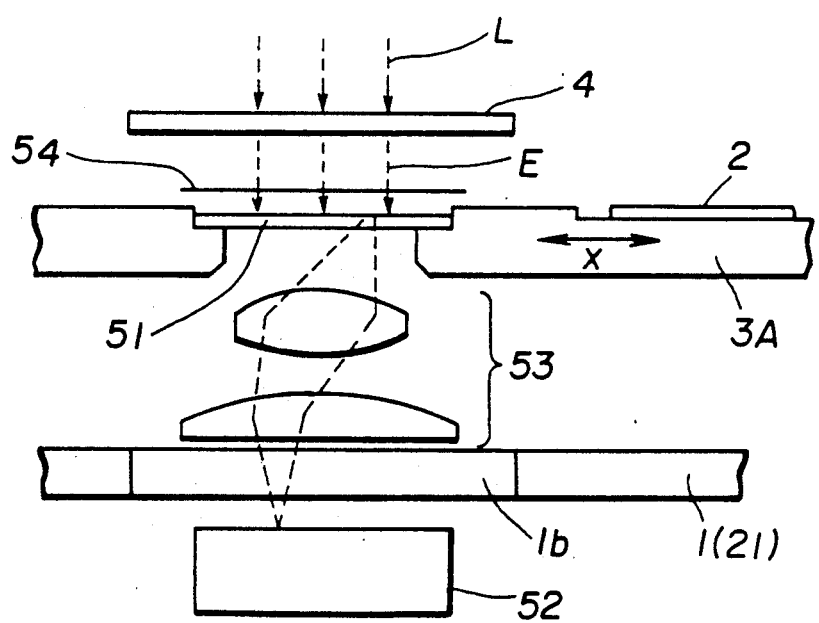
FIG. 11 is a side view showing a first embodiment of an essential part of the photoelectron image projection apparatus shown in FIG. 10.

FIG. 11 shows a first embodiment of an essential part of the second embodiment of the photoelectron image projection apparatus. In this embodiment, the two-dimensional electron beam detector 50 has a fluorescent plate 51, a television camera 52 and a lens system 53 for optically coupling the fluorescent plate 51 and the television camera 52. The fluorescent plate 51 is arranged at a position which the wafer 2 will take when carrying out the projection. The stage 3A, replacing the stage 3 of the conventional photoelectron image projection apparatus, holds the wafer 2 and the fluorescent plate 51 and can move both the wafer 2 and the fluorescent plate 51 as indicated by an arrow "X" to the position confronting the mask 4. The positions of the television camera 52 and the lens system 53 are fixed. A window 1b is provided in the side wall of the projection chamber 1 which is also used as the pattern detecting chamber 21.

The fluorescent plate 51 receives the irradiation of the photoelectrons E from the entirety of the individual projection region 141 of the mask 4, and emits a fluorescent light with an intensity distribution dependent on the photoelectron intensity distribution. The television camera 52 converts the intensity distribution into an image signal. It is possible to omit the lens system 53 if the television camera 52 can directly pick up the image from the fluorescent plate 51.

When the fluorescent plate 51 displays the intensity distribution, the ultraviolet light L transmitted through the mask 4 may mix in as a noise signal source. In such a case, a light metal film 54 such as an aluminum film having a thickness of 1 micron is arranged in front of the fluorescent plate 51 so as to cut the light which becomes the source of the noise so that only the photoelectrons E reach the fluorescent plate 51.

The photoelectron intensity distribution changes depending on the configuration and arrangement of the pattern of the mask 4 even when the photoelectric layer 4c of the mask 4 is uniform. Hence, a reference image signal, corresponding to a reference intensity distribution which is anticipated depending on only the configuration and arrangement of the pattern of the mask 4, is obtained beforehand. For example, the reference image signal can be obtained by use of a television camera and a mask identical to the mask 4 but having no photoelectric layer 4c. The non-uniformity of the photoelectric layer 4c of the mask 4 can be detected by comparing the image signal from the television camera 52 and the reference image signal.

Accordingly, after the photoelectric layer 4c is deposited on the mask 4, it is possible to detect the defect (non-uniformity of the photoelectric layer 4c) prior to the actual image projection, so as to avoid the loss of time and waste of material that would occur if the image projection were carried out with the defective mask 4. In general, each of the projection regions 141 through 144 of the mask 4 corresponds to one semiconductor chip. For this reason, when the defect is detected with the projection region 141 of the mask 4, the projection region used can simply be changed to another projection region which is other than the projection region 141 by moving the holder 23 (5).

Figure 12:
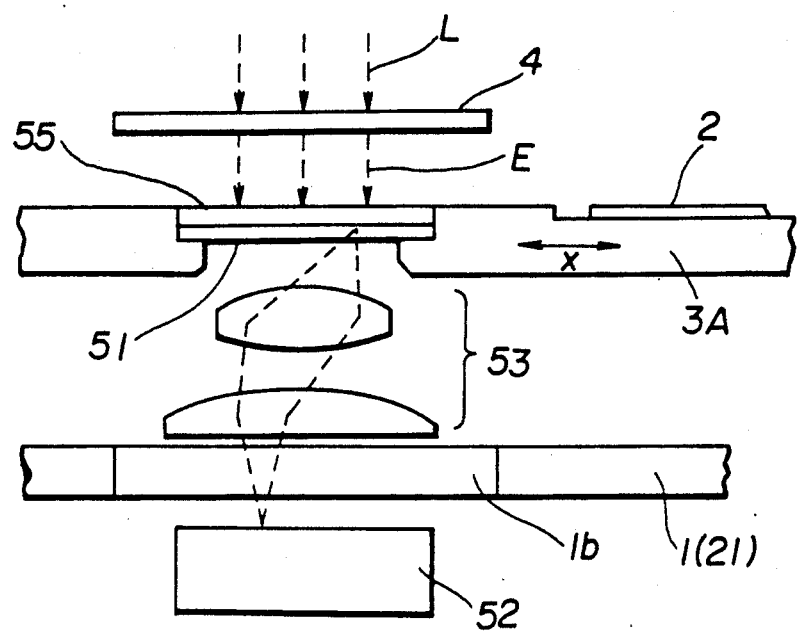
FIG. 12 is a side view showing a second embodiment of an essential part of the photoelectron image projection apparatus shown in FIG. 10.

FIG. 12 shows a second embodiment of the essential part of the second embodiment of the photoelectron image projection apparatus. In FIG. 12, those parts which are the same as those corresponding parts in FIG. 11 are designated by the same reference numerals, and a description thereof will be omitted. In this embodiment, a two-dimensional electron beam multiplier 55 is arranged on top of the fluorescent plate 51 at a position which the wafer 2 will take at the time of the projection so that the photoelectrons E are received from the entirety of the individual projection region 141 of the mask 4. For example, the two-dimensional electron beam multiplier 55 is a microchannel plate (MCP) and becomes the projection surface of the image formed by the photoelectrons E. The two-dimensional electron beam multiplier 55 multiplies the intensity of the photoelectrons E at each portion within the projection surface so as to increase the input with respect to the fluorescent plate 51. The remaining parts of this embodiment are identical to those of the first embodiment shown in FIG. 11.

Figure 13:
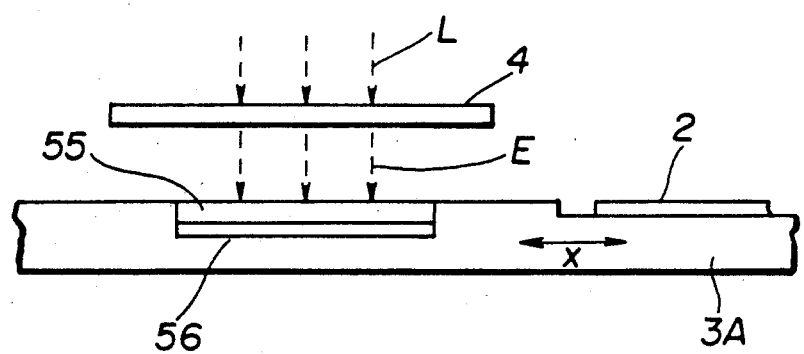
FIG. 13 is a side view showing a third embodiment of an essential part of the photoelectron image projection apparatus shown in FIG. 10.

FIG. 13 shows a third embodiment of the essential part of the photoelectron image projection apparatus. In FIG. 13, those parts which are the same as those corresponding parts in FIG. 12 are designated by the same reference numerals, and a description thereof will be omitted. In this embodiment, the two-dimensional electron beam multiplier 55 becomes the projection surface of the image, and a two-dimensional electron beam detecting element 56 such as a two-dimensional charge coupled device (CCD) is arranged immediately under the two-dimensional electron beam multiplier 55 thereby to constitute tne two-dimensional electron beam detector 50. The two-dimensional electron beam detecting element 56 converts the image formed by the photoelectrons E into an image signal in the alternative to the use of the fluorescent plate 51 and the television camera 52. The light metal film 54 is provided according to need as described before. The remaining parts of this embodiment are identical to those of the second embodiment shown in FIG. 12.

In the second embodiment of the photoelectron image projection apparatus, the photoelectron intensity distribution is detected at the position where the projection takes place with respect to the wafer 2 within the projection chamber 1. However, it is possible to detect the photoelectron intensity distribution at a position other than the position the wafer 2 takes at the time of the projection, and it is also possible to detect the photoelectron intensity distribution in a separate chamber which is connected to the projection chamber 1 similarly as in the case of the first embodiment of the photoelectron image projection apparatus shown in FIG. 1. In this case, the mutual relationship of the mask 4 and the two-dimensional electron beam detector 50 must be adjusted including the release and irradiation of the photoelectrons E.

Generally, the non-uniform distribution of the photoelectric layer 4c of the mask 4 is not extremely fine two-dimensionally. For this reason, when converging the photoelectrons E in order to detect the photoelectron intensity distribution, it is not essential that the converging of the photoelectrons E is precise as in the case of the image projection.

Therefore, according to the second embodiment of the photoelectron image projection apparatus, the defect in the projection pattern, that is, the non-uniform distribution of the photoelectric layer 4c of the mask 4, can be detected prior to the actual exposure carried out in the projection chamber 1. Hence, the mask 4 can be changed before the actual exposure when a defect is detected in the projection pattern, thereby preventing loss of time and waste of material, and the production efficiency is greatly improved over the conventional photoelectron image projection apparatus. In addition, the defect can be detected without deteriorating the photoelectric layer 4c of the mask 4.

In the first embodiment of the photoelectron image projection apparatus, the location of the pattern detecting chamber 21 is not limited to that shown in FIG. 3, and the pattern detecting chamber 21 may be located at a position other than the position between the projection chamber 1 and the vapor deposition chamber 11.

Further, the present invention is not limited to these embodiments, but various variations and modifications may be made without departing from the scope of the present invention.

What is claimed is:

1. A photoelectron beam image projection apparatus for detecting defects in a pattern, to be projected as a photoelectron beam image onto a wafer, relative to a desired pattern, the pattern to be projected being defined by a mask having a photoelectric layer thereon and the photoelectron beam image of the pattern being formed by selective irradiation of the photoelectric layer through the mask pattern and the corresponding release of photoelectrons from the selectively irradiated photoelectric layer, comprising:

a projection chamber;

means for holding the mask within said projection chamber;

means for emitting a light beam;

means for directing said light beam selectively onto each of plural, predetermined regions of the mask pattern, thereby to selectively irradiate respectively corresponding, plural regions of said photoelectric layer as defined by said mask pattern;

means for forming the photoelectrons released from each said selectively irradiated region of the photoelectric layer into a corresponding photoelectron beam and for projecting each said corresponding photoelectron beam so as to form a respectively corresponding photoelectron beam pattern region image on a predetermined image plane within said projection chamber;

image detector means positionable at said image plane for being irradiated by and detecting each said projected photoelectron beam pattern region image and producing a corresponding, detected pattern region image output signal;

movable stage means, disposed within said projection chamber, for holding and selectively positioning said wafer and said detector means within said projection chamber, said movable stage means being selectively movable to a first position at which said detector means is positioned at said image plane for being irradiated by each said projected photoelectron beam pattern region image and to a second position at which said wafer is positioned at said image plane for being irradiated by each said projected photoelectron beam pattern region image; and defect detector means for providing reference pattern region image signals for respectively corresponding, plural and predetermined regions of said desired pattern and for comparing each said detected pattern image region output signal of said image detector means with the respective reference pattern region image signal and producing a defect indication output signal when said compared signals differ.

2. A photoelectron beam image projection apparatus as claimed in claim 1 wherein:

said light beam source means comprises a single light beam source used in common at each of said first and second positions of said movable stage means and correspondingly with respect to forming and projecting the photoelectron beam pattern region images onto each of said detector means and said wafer, respectively.

3. A photoelectron beam image projection apparatus as claimed in claim 1 in which each said predetermined region of the mask pattern corresponds to an individual semiconductor chip and said plurality of regions respectively correspond to a plurality of individual semiconductor chips, said holder means being selectively movable, in association with said first position of said movable stage means, for selectively and individually irradiating each of said plurality of regions of the mask pattern so that a defect can be detected by said detector means for each of said plurality of regions of the mask pattern.

4. A photoelectron beam image projection apparatus as claimed in claim 1, further comprising a deposition chamber connected to said projection chamber, said deposition chamber having means for depositing said photoelectric layer onto said mask.

5. A photoelectron beam image projection apparatus as claimed in claim 1 in which each said predetermined region of the mask corresponds to a portion of one semiconductor chip and wherein the composite of said plurality of predetermined regions defines a single semiconductor.

6. A photoelectron beam image projection apparatus as claimed in claim 5 wherein said holder means is selectively movable at said second position of said movable stage means for selectively irradiating said plurality of regions of the mask pattern, in succession, onto corresponding portions of said wafer, the composite of the plurality of said projected pattern region images corresponding to the projection onto said wafer of said pattern of said single semiconductor chip.

7. A photoelectron beam image projection apparatus as claimed in claim 4, further comprising a pattern detection chamber connected to said projection chamber, said movable stage means moving said electron beam detector means to said first position inside said pattern detection chamber.

8. A photoelectron beam image projection apparatus as claimed in claim 7, wherein said pattern detection chamber is positioned between said projection chamber and said deposition chamber.

* * * * *

UNITED STATES PATENT AND TRADEMARK OFFICE
CERTIFICATE OF CORRECTION

PATENT NO. : 5,029,222

DATED : July 2, 1991

INVENTOR(S) : YAMADA et al.

It is certified that error appears in the above-identified patent and that said Letters Patent is hereby corrected as shown below:

Col. 1, line 35, after "confronting" insert --, i.e.,--;
line 38, delete "of";
line 65, after "which" insert --has--.

Col. 5, line 6, change "designed" to --designated--.

Col. 6, line 7, change "patter" to --pattern--;
line 38, change "detect" to --detector--.

Signed and Sealed this

Thirteenth Day of July, 1993

Attest:

MICHAEL K. KIRK

Attesting Officer     Acting Commissioner of Patents and Trademarks